United States Patent [19]
Wada et al.

[11] Patent Number: 5,313,418
[45] Date of Patent: May 17, 1994

[54] SEMICONDUCTOR MEMORY AND MEMORIZING METHOD TO READ ONLY SEMICONDUCTOR MEMORY

[75] Inventors: Toshio Wada; Yuichi Egawa, both of Sagamihara, Japan

[73] Assignee: Nippon Steel, Tokyo, Japan

[21] Appl. No.: 967,430

[22] Filed: Oct. 28, 1992

[30] Foreign Application Priority Data

Oct. 31, 1991 [JP] Japan .................................. 3-313460

[51] Int. Cl.$^5$ .............................................. G11C 17/10
[52] U.S. Cl. ....................................... 365/104; 365/96
[58] Field of Search ..................... 365/94, 96, 100, 104

[56] References Cited

U.S. PATENT DOCUMENTS

| | | | |
|---|---|---|---|
| 4,802,121 | 1/1989 | Schreck et al. | 365/104 |
| 4,888,735 | 12/1989 | Lee | 365/104 X |
| 5,049,763 | 9/1991 | Rogers | 307/443 |

OTHER PUBLICATIONS

"Design of CMOS Ultra LSI", Baifukan Co., Ltd., Apr. 25, 1989, Takuo Sugano, pp. 168–169.

*Primary Examiner*—Joseph A. Popek
*Attorney, Agent, or Firm*—Pollock, Vande Sande & Priddy

[57] ABSTRACT

A mask ROM of the invention comprises: a plurality of memory cells arranged m a matrix; a plurality of word lines, each connecting gates of the memory cells in the lateral direction; a plurality of bit lines which are constructed by serially connecting MOS transistors constructing the memory cells; a row decoder connected to the word lines; and a column decoder connected to the bit lines in which each memory cell is constructed by an MOS transistor and a resistor connected in parallel between the source and drain of each MOS transistor. The content of each memory cell is determined by whether the resistor 8 is cut out or not so that the steps up to the cutting step of the resistors 8 can be standardized while maintaining a high density in integration of the memory cells and the turn-around time can be reduced.

16 Claims, 4 Drawing Sheets

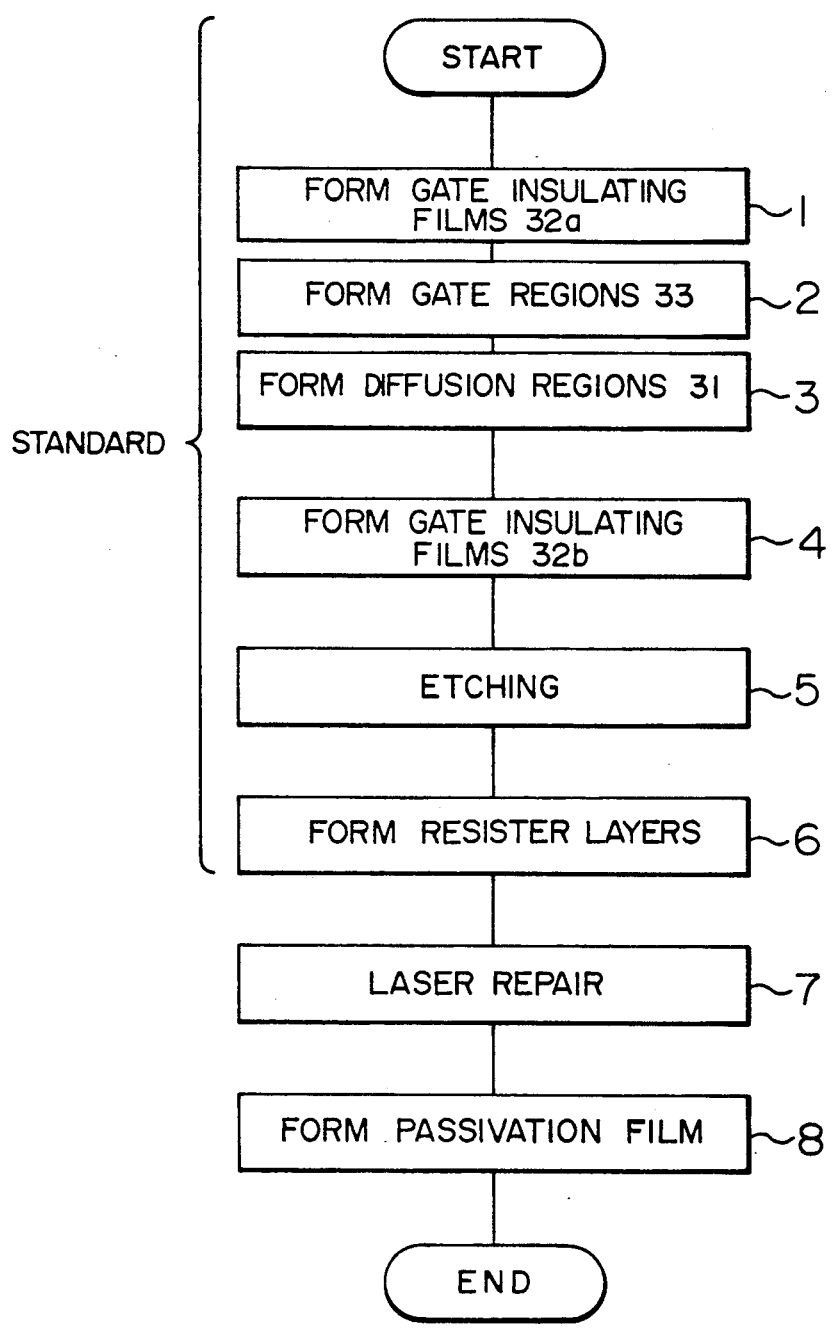

SEMICONDUCTOR MEMORY AND MEMORIZING METHOD TO READ ONLY SEMICONDUCTOR MEMORY

BACKGROUND OF THE INVENTION

The invention relates to a semiconductor memory device and, more particularly, to what is called a mask ROM (Read Only Memory) in which writing a program or other data into a memory is executed during manufacturing processes.

Generally, as a method of writing data into the mask ROM, there are several methods including a diffusion layer program method, an ion implantation program method, a contact hole program method, and the like as disclosed in Takuo Sugano, "The Design of CMOS Ultra LSI," Baifukan Co., Ltd., pages 168 to 169.

Among them, the diffusion layer program method and the ion implantation program method have advantages such that a memory cell area per bit can be reduced and connecting the cells can be made by series type wirings in which the cells are laminated in the vertical direction.

FIG. 1 shows a circuit diagram of a mask ROM formed by the typical conventional ion implantation program method. MOS transistors 72 constructing memory cells are arranged in a matrix. A source and a drain of each MOS transistor 72 shown in the vertical direction in the diagram are connected in series to a drain and a source of the adjacent MOS transistor 72, thereby forming each of MOS transistor trains a to n. A line connecting the MOS transistors which provide each MOS transistor train is called a bit line 54. A line in the lateral direction connecting gates of the corresponding transistors of the respective MOS transistor trains is called a word line. Reference numeral 62 denotes a row decoder connected to the word lines 52. Reference numeral 64 indicates a column decoder connected to the bit lines 54.

Actually, the drain and source regions of adjacent MOS transistors 72a and 72b are made in a common diffusion region. Gate regions are formed between the diffusion regions which are linearly arranged at regular intervals when viewed on a plan view. One end of the diffusion region is used as a source region of one MOS transistor and the other end is used as a drain region of the adjacent MOS transistor. Therefore, there is no need in particular to provide a line to connect the drain and the source of adjacent transistors so that a density of the memory cells can be raised.

A method of recording data into such an MOS transistor memory will now be described. A threshold voltage $V_{th}$ of each MOS transistor 72 is set to a voltage of the enhancement type. Then, ions are implanted into only the MOS transistors constructing the memory cells, which are selected in accordance with the data to be written so that the threshold voltage $V_{th}$ of each of the selected MOS transistor is changed from the enhancement type to the depletion type.

The data is read out in the following manner from the memory in which the data has been written as mentioned above.

First, all of the word lines 52 are set to the high level by the row decoder 62. Subsequently, only a selected word line 52 is set to the low level and a selected bit line 54 is set to the high level. In the case where the memory cell selected by the word line 52 and the bit line 54 is of the depletion type, the MOS transistor 72 is held in a conductive state and is not changed with the change of the word line from the high to the low level, so that a current continuously flows in the selected bit line 54. On the other hand, in the case where the selected memory cell is of the enhancement type, the MOS transistor 72 is turned off in response to the change of the word line from the high to the low level, so that the current flowing in the selected bit line 54 is cut off. Therefore, by selecting the memory cell to be read out by the row decoder 62 and column decoder 64, the data written in the memory cell by the ion implantation can be read out.

There are U.S. Pat. Nos. 5,049,763, 4,888,735, and 4,754,167, as prior art relating to the invention.

In case of the mask ROM by the ion implantation method, there are needed steps such that after the threshold voltage $V_{th}$ of the MOS transistor constructing each memory cell is once set to the enhancement type, the ion implantation is executed and the threshold voltage $V_{th}$ of the selected MOS transistor is changed from the enhancement type to the depletion type. Therefore, according to the mask ROM by the conventional method, although the memory cells integrated in a high density can be realized, there are problems such that a number of steps are required to write data and a TAT (Turn-Around Time, namely, a period of time which is required from the reception of the order of an ROM to the shipping of an article) becomes longer.

SUMMARY OF THE INVENTION

It is an object of the invention to provide a semiconductor memory device which can reduce the number of steps which are required to write data in a ROM while maintaining a high integration density of memory cells and can reduce the TAT.

Another object of the invention is to provide a method of writing data into a semiconductor memory device which can reduce the number of steps which are required to write data while maintaining a high integration density of memory cells and can reduce the TAT.

A semiconductor memory device according to the invention comprises: a switching element group which is arranged in a plurality of trains, each including a plurality of switching elements connected in series; a plurality of row lines each connecting control terminals of the corresponding switching elements of the respective trains of the switching elements; a column decoder connected to the switching element trains; a row decoder connected to the plurality of row lines; and impedance means connected to selected ones of the switching elements of the switching element group.

Data is written in accordance with the presence or absence of the connection of the impedance means.

In the best mode of the invention, after the impedance means is once connected to all of the switching elements, the impedance means is selectively cut out by a laser beam or the like. Therefore, the wafer manufacturing processes can be standardized and it is sufficient to merely cut out the impedance means selectively in accordance with the information to be written in the mask ROM as ordered, so that the TAT can be reduced.

BRIEF DESCRIPTION OF THE DRAWINGS

FIG. 5 is a flowchart of manufacturing steps of the mask ROM of the embodiment of the invention.

DESCRIPTION OF THE PREFERRED EMBODIMENT

An embodiment of the invention will be described hereinbelow.

Figure 2:
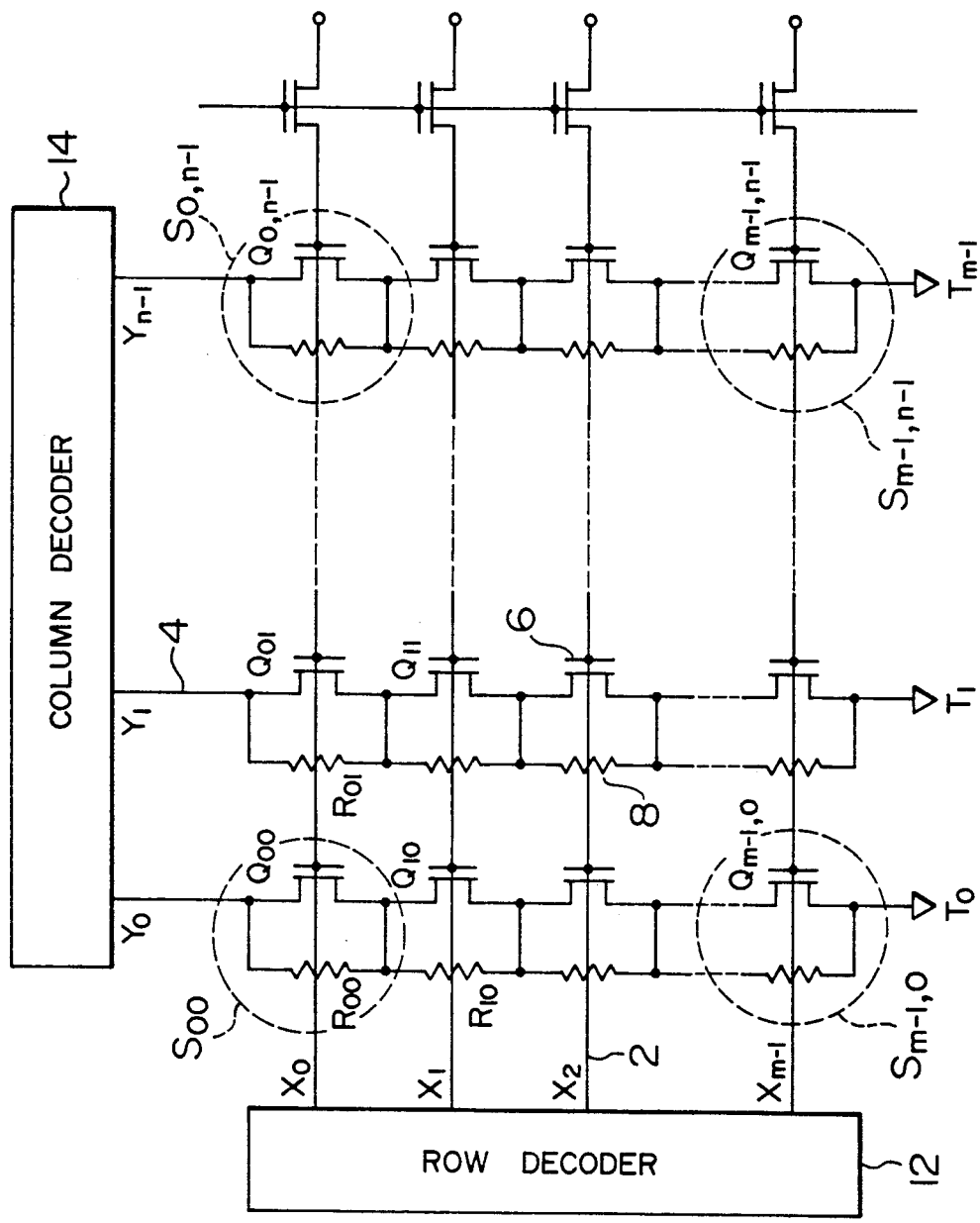
FIG. 2 shows an equivalent circuit diagram of a mask ROM of an embodiment of the invention.

FIG. 2 shows an equivalent circuit diagram of a mask ROM according to an embodiment of the invention. The mask ROM shown in FIG. 2 comprises: a plurality of memory cells ($S_{00}$, $S_{01}$, $S_{10}$, ..., $S_{m-1,n-1}$) arranged in rows and columns of a matrix; a plurality of word lines 2 ($X_0$, $X_1$, ..., $X_{m-1}$) connecting gates of the memory cells in the lateral direction; a plurality of bit lines 4 ($Y_0$, $Y_1$, ..., $Y_{n-1}$), formed of series connections of MOS transistors constructing the memory cells; a row decoder 12 connected to the word lines 2; and a column decoder 14 connected to the bit lines 4.

Each of the memory cells is constructed by an MOS transistor 6 ($Q_{00}$, $Q_{10}$, ..., $Q_{m-1,n-1}$) and a resistor 8 connected in parallel between a source and a drain of the MOS transistor 6. Each of the MOS transistors 6 is preset so as to have the threshold voltage $V_{th}$ of the enhancement type. The MOS transistors 6 arranged in the column direction are serially connected so that source and drain of adjacent MOS transistors are formed in a common diffusion region.

Figure 1:
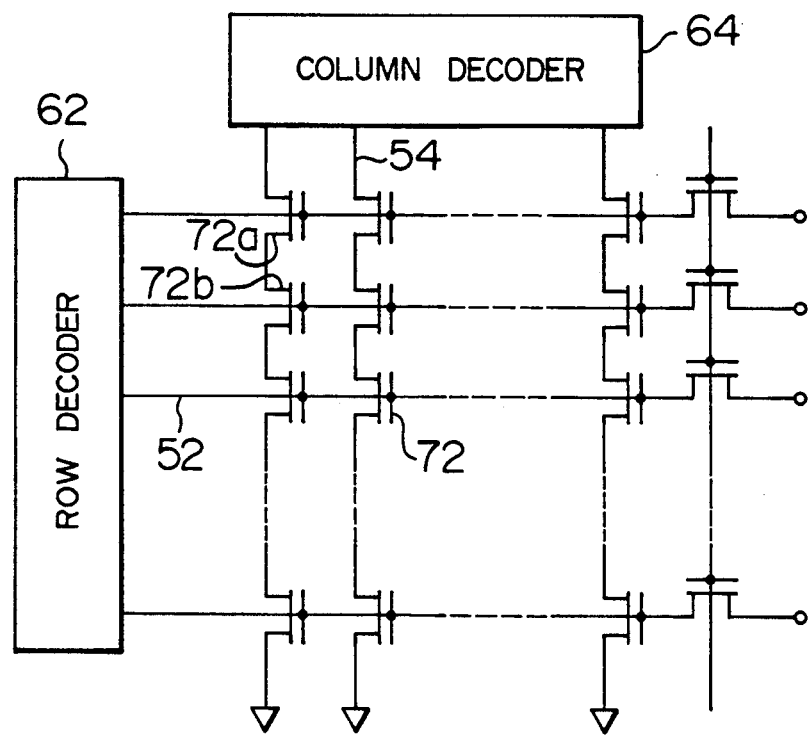
FIG. 1 shows an equivalent circuit diagram of a conventional mask ROM.
Figure 3:
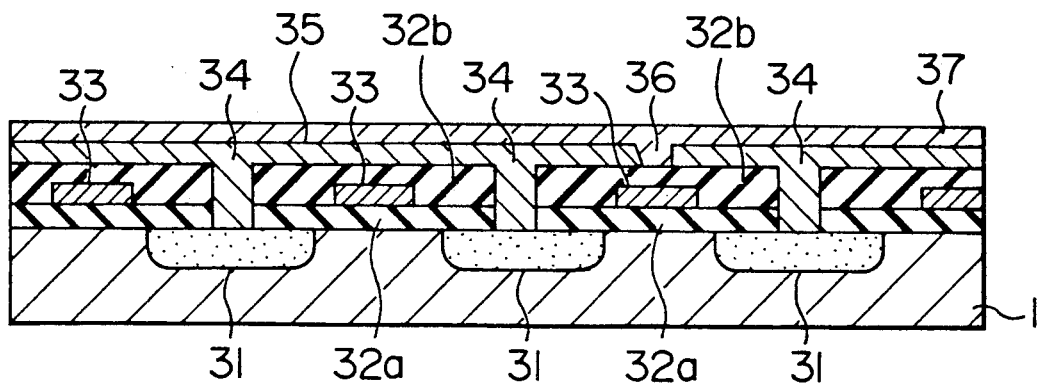
FIG. 3 shows a partial cross sectional view of the mask ROM of the embodiment of the invention.

The memory cell can be easily selected by selecting the word line 2 by the row decoder 12 and by selecting the bit line 4 by the column decoder 14. By forming the resistors 8 onto the surface (at a layer above the transistors) of a substrate 1 as shown in FIG. 3, the selective cut-out for writing data can be more easily performed by irradiating the laser beam, which will be explained hereinlater.

Steps of writing data into the mask ROM of FIG. 2 will now be described with reference to a flowchart of FIG. 5. As shown in FIG. 3, gate insulating films 32a are formed on the whole surface of the substrate 1 (step 1) and gate regions 33 are formed (step 2). The gate regions 33 are used as masks, and diffusion regions 31 serving as sources and drains of MOS transistors are formed in the substrate 1 by ion doping (step 3). A gate insulating film 32b is formed so as to cover the gate regions 33 (step 4). The above steps are the same as the manufacturing steps of the ordinary CMOS transistor. Holes 34 which reach the diffusion regions 31 are formed in the insulating film 32b by etching and resistance layers 35 are formed on the gate insulating film 32b to be filled in the holes 34 (step 6). The resistance layers 35 correspond to the resistors 8 shown in FIG. 2. The sources and drains of the MOS transistor are connected by the resistors 8.

Desired data is written into a standard or blank wafer which has been manufactured as mentioned above. Practically speaking, the resistance layers 35 are selectively cut out as shown by reference numeral 36 in FIGS. 3 and 4 by a laser repairing device in accordance with the data to be written (step 7). Finally, a passivation film 37 is formed to protect a chip and the manufacturing processes are finished (step 8). Step 6 may be executed after step 7.

The operation to read out the data from the mask ROM in which the data has been written as mentioned above will now be described. It is now assumed that the memory cell $S_{00}$ is selected. The bit line $Y_0$ is selected by the column decoder 14 and the voltage level is set to the high level. In such a state, only $X_0$ of the word line 2 is set to the low level and the other word lines ($X_1$, ..., $X_{m-1}$) are set to the high level. Thus, the memory cells $S_{10}$, to $S_{m-1,0}$ among the memory cells $S_{00}$ to $S_{m-1,0}$ connected to the bit line $Y_0$ are made conductive. Therefore, whether the output at an output terminal $T_0$ is set to the high level or the low level depends on the conductive state of the memory cell $S_{00}$. Since $X_0$ of the word line 2 is at the low level, the MOS transistor $Q_{00}$ constructing the memory cell $S_{00}$ is in the nonconductive state. When the resistor $R_{00}$ is not cut out, the source and drain of the MOS transistor $Q_{00}$ are connected by the resistor $R_{00}$, so that the memory cell $S_{00}$ is made conductive and the high level signal is generated to the output terminal $T_0$. On the contrary, when the resistor $R_{00}$ has been cut out, the source and drain of the MOS transistor $Q_{00}$ are not connected by the resistor $R_{00}$, so that the memory cell $S_{00}$ is made nonconductive and the low level signal is generated to the output terminal $T_0$. Similarly, by sequentially setting the voltage levels of the bit lines $Y_1$ to $Y_{n-1}$ to the high level by the column decoder 14, the data in the memory cells $S_{01}$ to $S_{0,n-1}$ are sequentially generated to the output terminals $T_1$ to $T_{n-1}$.

According to the mask ROM of the embodiment as mentioned above, the memory cell is constructed by the MOS transistor and the resistor 8 connected in parallel between the source and the drain of the MOS transistor and the data is written in accordance with the presence or absence of the cut-out of the resistor, so that the writing step of the data can be simplified. Particularly, since the manufacturing processes before the cutting step of the resistors can be standardized, the device can be previously manufactured without writing the data therein. The TAT which is a period of time required from the reception of the order to the shipping of the device can be reduced.

Figure 4:
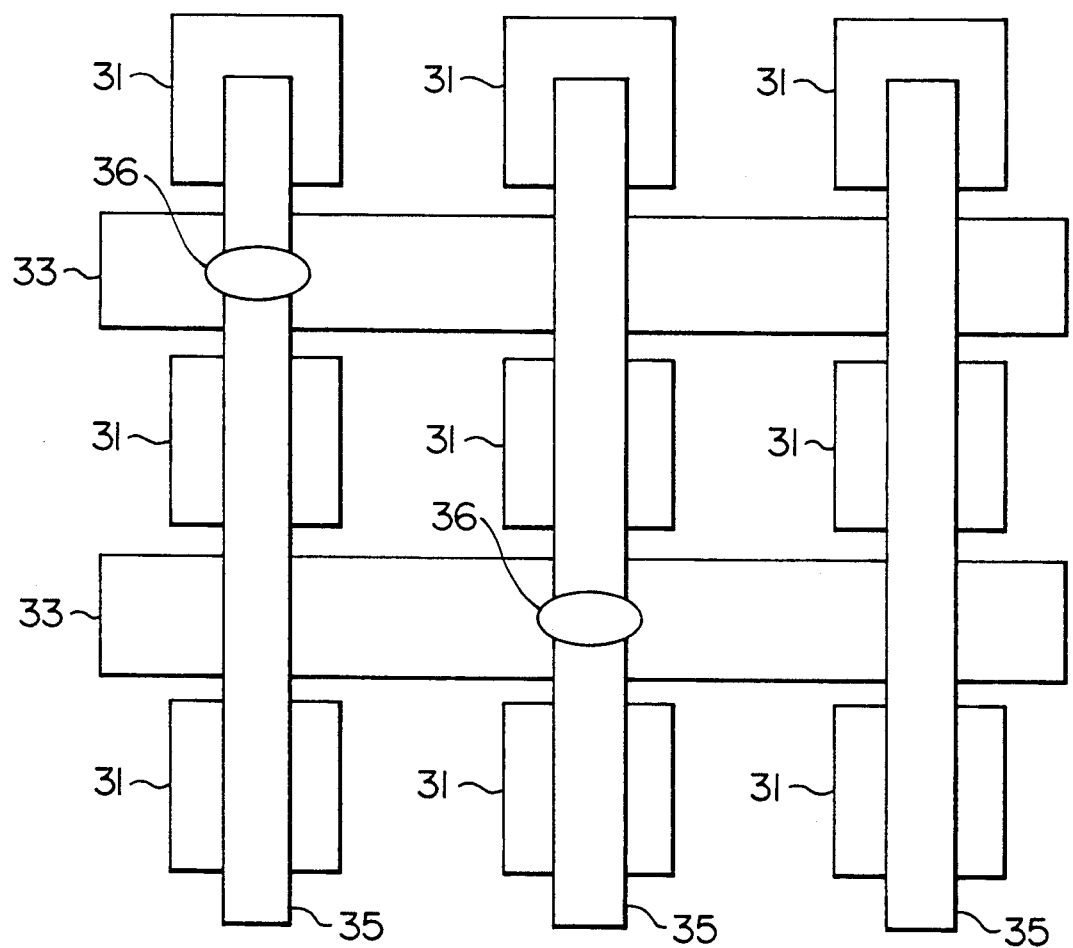
FIG. 4 shows a partial plan view of the mask ROM of the embodiment of the invention.

As shown in FIG. 4, since the resistor is merely arranged between the source and the drain of each MOS transistor, the cell area per bit is not increased.

In the embodiment, although the resistor 8 has been used as an impedance device connecting the source and drain of each MOS transistor, an active element such as a capacitor or the like can be also used.

We claim:

1. A semiconductor memory device comprising:
   a plurality of switching elements arranged in a matrix of rows and columns, each switching element having a control terminal and a current path, the current paths of the switching elements of a column being connected in series;
   a plurality of row lines, each being connected to the control terminals of the switching elements in one of the rows;
   a column decoder connected to said switching elements of the respective columns for selecting the switching elements connected in one of the columns;
   a row decoder connected to said plurality of row lines for selecting one of the row lines; and
   impedance means connected in parallel to the current paths of selected ones of said plurality of switching elements.

2. A device according to claim 1, wherein said switching elements are MOS type transistors.

3. A device according to claim 2, wherein each of said MOS type transistors has a source and drain which provides the current path and the source of one of adjacent two MOS type transistors of each column is connected to the drain of the other of the adjacent two MOS type transistors of the same column.

4. A device according to claim 3, wherein said impedance means includes an impedance element connected between the source and the drain of each of the selected ones of said MOS type transistors.

5. A device according to claim 2, wherein said MOS type transistor is of the enhancement type.

6. A device according to claim 1, wherein the impedance means includes impedance elements formed for all the switching elements, respectively, each of the impedance elements which are formed for all the switching elements other than the selected ones thereof, being at least partially removed.

7. A device according to claim 1, wherein said impedance means includes an impedance element connected in parallel to the current path of each of the selected ones of said switching elements.

8. A device according to claim 5, wherein said impedance element is a resistor element.

9. A semiconductor memory device comprising:
a switching element matrix arranged in a plurality of columns, each column including a plurality of switching elements, each having a control terminal and a current path, the current paths of said plurality of switching elements being connected in series;
a plurality of row lines each being connected to the control terminals of corresponding switching elements of the respective columns;
a column decoder connected to the switching elements of the respective columns for electing the switching elements of one of the columns;
a row decoder connected to said plurality o row lines for selecting one of the row lines;
a plurality of impedance means connected in parallel to the current paths of selected switching elements in said switching element matrix.

10. A device according to claim 9, wherein each of said switching element si an MOS type transistor.

11. A device according to claim 10, wherein said MOS type transistor includes a source and drain which provides the current path and the source of one of two adjacent MOS type transistors of each column is connected to the drain of the other of the two adjacent MOS type transistors.

12. A device according to claim 11, wherein said impedance means is an impedance element connected in parallel between the source and the drain of each MOS type transistor.

13. A device according to claim 10, wherein said impedance means is connected a source and a drain of each MOS type transistor.

14. A device according to claim 9, wherein said impedance means is a resistor.

15. A method of writing data into a semiconductor memory device comprising a switching element group which is arranged in a plurality of columns, each including a plurality of switching elements, each having a control terminal and a current path, the current paths of the switching elements of each column being connected in series, a plurality of row lines each being connected to the control terminals of corresponding switching elements of the respective columns, a column decoder connected to the switching elements of the respective columns for selecting the switching elements connected in one of the columns, and a row decoder connected to said plurality of row lines for selecting one of the row lines, said method comprising the steps of:
forming impedance means connected in parallel to the current path of each of the switching elements in the switching element group; and
selectively removing the impedance means connected to the current paths of selected ones of said switching elements.

16. A method of storing data into a semiconductor memory device comprising a switching element group which is arranged in a plurality of columns, each including a plurality of switching elements, each switching element having a control terminal and a current path, the current paths of the switching elements of each column being connected in series, a plurality of row lines, each being connected to the control terminals of corresponding switching elements of the respective columns, a column decoder connected to the switching elements of the respective columns for selecting the switching elements connected in one of the columns, a row decoder connected to said plurality of row lines for selecting one of the row lines, and impedance means connected in parallel to the current path of each of the switching elements in each column, said method comprising the steps of:
selectively removing said impedance means connected to selected ones of said switching elements selected in accordance with data to be stored.

* * * * *

UNITED STATES PATENT AND TRADEMARK OFFICE
CERTIFICATE OF CORRECTION

PATENT NO. : 5,313,418
DATED : May 17, 1994
INVENTOR(S) : Wada, et. al.

It is certified that error appears in the above-indentified patent and that said Letters Patent is hereby corrected as shown below:

Title page, item [73], Assignee: should be--Nippon Steel Corporation--

Signed and Sealed this

Second Day of January, 1996

Attest:

BRUCE LEHMAN

*Attesting Officer*    *Commissioner of Patents and Trademarks*